(12) United States Patent
Nakamura

(10) Patent No.: US 10,847,489 B2
(45) Date of Patent: Nov. 24, 2020

(54) SEMICONDUCTOR DEVICE

(71) Applicant: Mitsubishi Electric Corporation, Tokyo (JP)

(72) Inventor: Hiroyuki Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/540,472

(22) Filed: Aug. 14, 2019

(65) Prior Publication Data

US 2020/0144216 A1 May 7, 2020

(30) Foreign Application Priority Data

Nov. 7, 2018 (JP) .................. 2018-209356

(51) Int. Cl.
*H01L 23/00* (2006.01)
*H01L 25/18* (2006.01)
*H01L 23/525* (2006.01)
*H01L 23/31* (2006.01)
*H01L 23/62* (2006.01)
(Continued)

(52) U.S. Cl.
CPC .......... *H01L 24/49* (2013.01); *H01L 23/3107* (2013.01); *H01L 23/3135* (2013.01); *H01L 23/4952* (2013.01); *H01L 23/49562* (2013.01); *H01L 23/49575* (2013.01); *H01L 23/5256* (2013.01); *H01L 23/62* (2013.01); *H01L 24/48* (2013.01); *H01L 25/071* (2013.01); *H01L 25/072* (2013.01); *H01L 25/18* (2013.01); *H01L 23/3737* (2013.01); *H01L 24/32* (2013.01); *H01L 24/73* (2013.01); *H01L 2224/04042* (2013.01); *H01L 2224/32245* (2013.01); *H01L 2224/48139* (2013.01); *H01L 2224/48247* (2013.01); *H01L 2224/4903* (2013.01); *H01L 2224/49051* (2013.01); *H01L 2224/73265* (2013.01);
(Continued)

(58) Field of Classification Search
CPC ..... H01L 24/49; H01L 25/071; H01L 25/072; H01L 23/49562; H01L 23/49575; H01L 23/4952; H01L 23/3107; H01L 24/48; H01L 23/62; H01L 25/18; H01L 23/5256; H01L 23/3135; H01L 23/3737; H01L 2224/48139; H01L 24/73; H01L 24/32
See application file for complete search history.

(56) References Cited

FOREIGN PATENT DOCUMENTS

JP     2013-239697 A    11/2013
WO   WO2020004153    *   1/2020

* cited by examiner

*Primary Examiner* — Matthew L Reames
(74) *Attorney, Agent, or Firm* — Studebaker & Brackett PC

(57) ABSTRACT

A first wire has a first contact connected to a first semiconductor element, and a second contact connected to a second semiconductor element. A second wire has a third contact connected to the first semiconductor element and a fourth contact connected to the second semiconductor element. A first linear portion between the first contact and the second contact of the first wire has an undulation. A second linear portion between the third contact and the fourth contact of the second wire has an undulation. A first top portion of the first linear portion is adjacent to a second top portion of the second linear portion. An interval between the first top portion and the second top portion is narrower than an interval between the first contact and the third contact. The interval between the first top portion and the second top portion is narrower than an interval between the second contact and the fourth contact.

4 Claims, 6 Drawing Sheets

(51) Int. Cl.
H01L 23/495 (2006.01)
H01L 25/07 (2006.01)
H01L 23/373 (2006.01)

(52) U.S. Cl.
CPC ................ *H01L 2224/8592* (2013.01); *H01L 2924/1815* (2013.01)

SEMICONDUCTOR DEVICE

BACKGROUND OF THE INVENTION

Field of the Invention

The present invention relates to a semiconductor device having a configuration in which a plurality of semiconductor elements are connected by a plurality of wires.

Description of the Background Art

A semiconductor device such as a semiconductor device for electric power or the like is provided with a plurality of semiconductor elements. Adjacent two semiconductor elements included in the plurality of semiconductor elements may be connected, for example, by the plurality of wires. In the semiconductor device, an overcurrent sometimes flows in the relevant plurality of wires due to various factors. The relevant various factors are, for example, occurrence of a short circuit portion, generation of static electricity, and the like. In the following description, a situation where an overcurrent flows in the plurality of wires connecting the adjacent two semiconductor elements is also referred to as an "overcurrent situation".

In the overcurrent situation, there is a possibility that both or one of the relevant two semiconductor elements to which the plurality of wires are connected breaks down. In order to suppress the occurrence of the above-described affair, a technique of utilizing the wires in the semiconductor device as fuses has been used.

In Japanese Patent Application Laid-Open No. 2013-239697, there has been disclosed a configuration using the technique of utilizing wires as fuses (hereinafter, also referred to as a "related configuration A").

SUMMARY

There is a semiconductor device having a configuration in which adjacent two semiconductor elements are connected by a plurality of wires. There is a possibility that in the overcurrent situation, the relevant plurality of wires are not fused due to the overcurrent. There is a problem that if the relevant plurality of wires are not fused due to the overcurrent, there is a possibility that the relevant semiconductor element breaks down due to the overcurrent.

An object of the present invention is to provide a semiconductor device in which a wire is easily fused in a situation where an overcurrent flows in the relevant wire.

A semiconductor device according to one aspect of the present invention includes a first semiconductor element, and a second semiconductor element adjacent to the first semiconductor element in a plan view. The first semiconductor element is connected to the second semiconductor element by a first wire and a second wire, the first wire has a first contact connected to the first semiconductor element, and a second contact connected to the second semiconductor element, the second wire has a third contact connected to the first semiconductor element, and a fourth contact connected to the second semiconductor element, a first linear portion of the first wire has an undulation, the first linear portion being a portion between the first contact and the second contact, a second linear portion of the second wire has an undulation, the second linear portion being a portion between the third contact and the fourth contact, a first top portion of the first linear portion is adjacent to a second top portion of the second linear portion, an interval between the first top portion and the second top portion is narrower than an interval between the first contact and the third contact, and the interval between the first top portion and the second top portion is narrower than an interval between the second contact and the fourth contact.

According to the present invention, the first wire has the first contact connected to the first semiconductor element, and the second contact connected to the second semiconductor element. The second wire has the third contact connected to the first semiconductor element, and the fourth contact connected to the second semiconductor element.

The first linear portion of the first wire has an undulation, the first linear portion being the portion between the first contact and the second contact. The second linear portion of the second wire has an undulation, the second linear portion being the portion between the third contact and the fourth contact.

The first top portion of the first linear portion is adjacent to the second top portion of the second linear portion. The interval between the first top portion and the second top portion is narrower than the interval between the first contact and the third contact. The interval between the first top portion and the second top portion is narrower than the interval between the second contact and the fourth contact.

This makes temperatures of the first top portion and the second top portion higher than temperatures of the first contact and the third contact in a situation where an overcurrent flows in the wires. Therefore, the first top portion, which is a part of the first wire, and the second top portion, which is part of the second wire, are easy to fuse due to the overcurrent. That is, a semiconductor device in which the relevant wire is easily fused in the situation where the overcurrent flows in the wire can be provided.

These and other objects, features, aspects and advantages of the present invention will become more apparent from the following detailed description of the present invention when taken in conjunction with the accompanying drawings.

DESCRIPTION OF THE PREFERRED EMBODIMENT

Hereinafter, a preferred embodiment will be described with reference to the drawings. In the following drawings, the same components are denoted by the same reference sign. Names and functions of the components denoted by the same reference sign are the same. Therefore, a detailed description of each of the components denoted by the same reference sign may be omitted.

It should be noted that dimensions, a material, and a shape of each of the components, relative arrangement of the relative components, and the like exemplified in the preferred embodiment may be appropriately changed according to a configuration of a device, various conditions, and the like. Moreover, the dimensions of each of the components in each of the drawings may be different from actual dimensions.

First Preferred Embodiment

Figure 1:
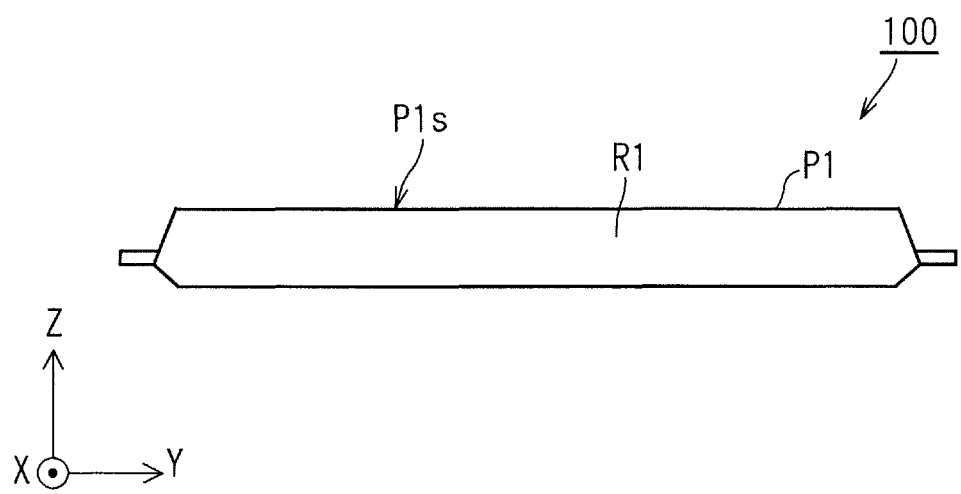
FIG. 1 is a side view of a semiconductor device according to a first preferred embodiment.

FIG. 1 is a side view of a semiconductor device 100 according to a first preferred embodiment. The semiconductor device 100 is, for example, a semiconductor device for electric power. In FIG. 1, an X direction, a Y direction, and a Z direction are orthogonal to one another. The X direction, the Y direction, and the Z direction shown in the following figures are also orthogonal to one another. In the following description, a direction including the X direction and a direction opposite to the X direction (-X direction) is also referred to as an "X axis direction". Moreover, in the following description, a direction including the Y direction and a direction opposite to the Y direction (-Y direction) is also referred to as a "Y axis direction". In the following description, a direction including the Z direction and a direction opposite to the Z direction (-Z direction) is also referred to as a "Z axis direction".

In the following description, a plane including the X axis direction and the Y axis direction is also referred to as an "XY plane". In the following description, a plane including the X axis direction and the Z axis direction is also referred to as an "XZ plane". In the following description, a plane including the Y axis direction and the Z axis direction is also referred to as a "YZ plane".

Referring to FIG. 1, the semiconductor device 100 includes a package P1. The package P1 has an upper surface P1s. The package P1 is made of a resin R1. That is, the semiconductor device 100 includes the resin R1.

Figure 2:
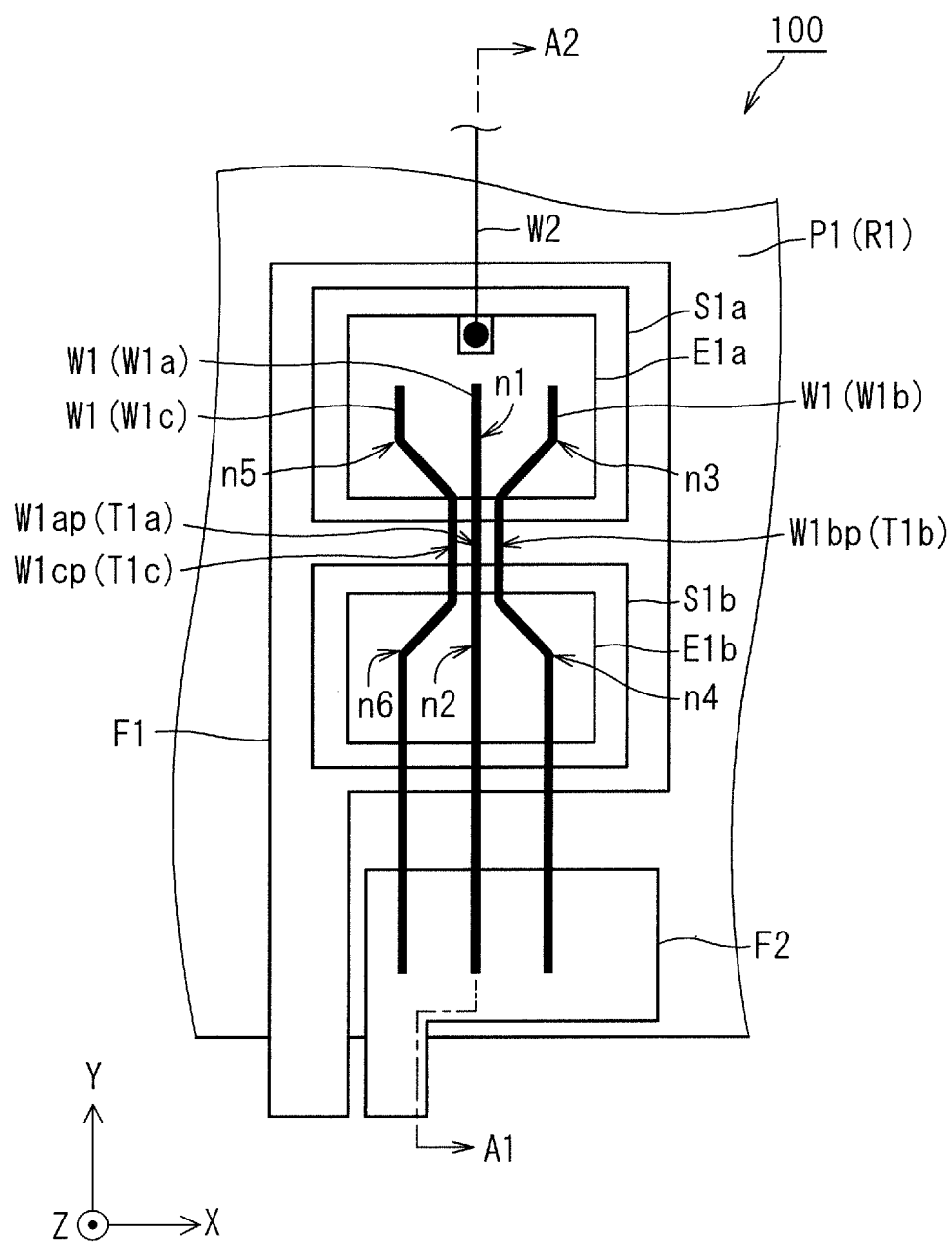
FIG. 2 is a plan view showing a part of the semiconductor device according to the first preferred embodiment.
Figure 3:
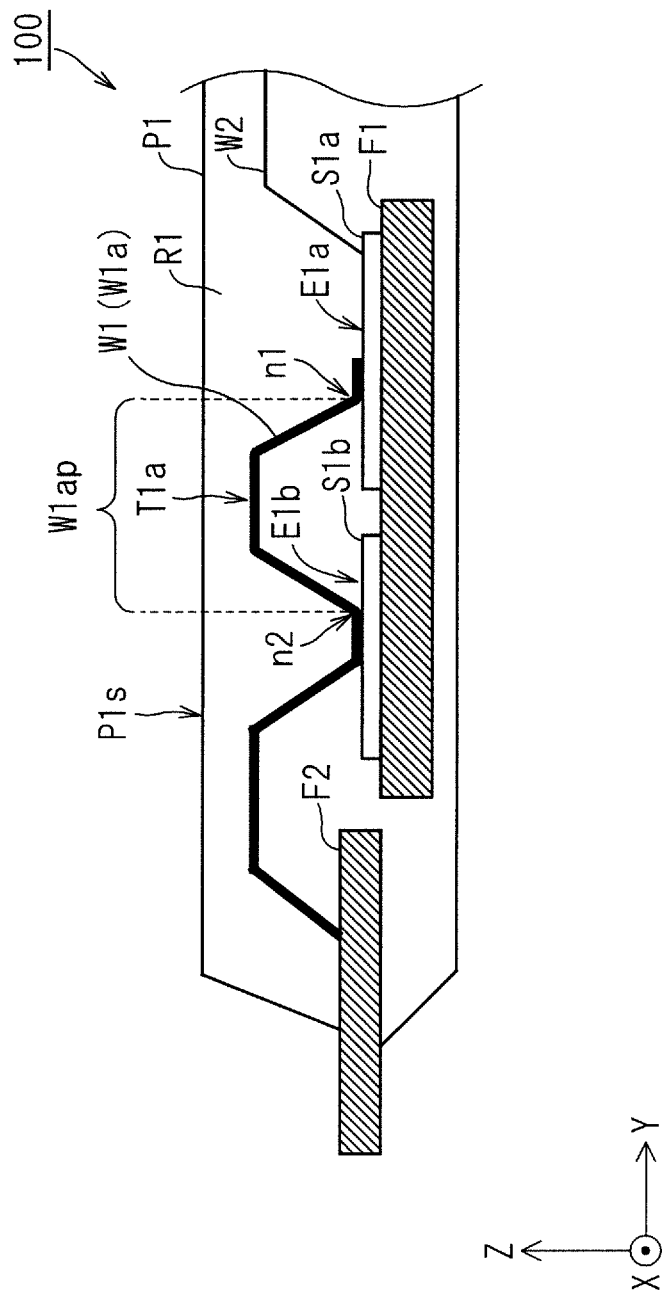
FIG. 3 is a cross-sectional view of the semiconductor device along a long dashed short dashed line A1-A2 in FIG. 2.

FIG. 2 is a plan view showing a part of the semiconductor device 100 according to the first preferred embodiment. FIG. 2 shows an internal configuration of the package P1. Moreover, in FIG. 2, one arm portion in the semiconductor device 100 is shown. FIG. 3 is a cross-sectional view of the semiconductor device 100 along a long dashed short dashed line A1-A2 in FIG. 2.

Referring to FIGS. 2 and 3, the semiconductor device 100 further includes lead frames F1, F2, a semiconductor element S1a, a semiconductor element S1b, and a plurality of wires W1.

A shape of each of the lead frames F1, F2 is a plate shape. Each of the lead frames F1, F2 is made of metal. Each of the lead frames F1, F2 is a plate-shaped metal machined into wiring.

The lead frame F1 has the semiconductor elements S1a, S1b mounted thereon. The semiconductor element S1b is adjacent to the semiconductor element S1a in a plan view (XY plane). The semiconductor element S1a is, for example, an IGBT (Insulated Gate Bipolar Transistor) as a switching element. The IGBT has a function of controlling a flow of a main current. The semiconductor element S1b is, for example, a free wheeling diode. The free wheeling diode has a function of causing a reflux current to flow when the IGBT is in an off state.

The semiconductor element S1a and the semiconductor element S1b are electrically connected in antiparallel by the plurality of wires W1 and the lead frame F1, details of which will be described later.

In an upper surface of the semiconductor element S1a, an electrode E1a is provided. The electrode E1a is an emitter electrode. In a bottom surface of the semiconductor element S1a, a collector electrode (not shown) is provided. The collector electrode (not shown) of the semiconductor element S1a is connected to the lead frame F1. The lead frame F1 functions as an external connection terminal (collector-side terminal) on a side of a collector of the IGBT.

In an upper surface of the semiconductor element S1b, an electrode E1b is provided. The electrode E1b is an anode electrode. In a bottom surface of the semiconductor element S1b, a cathode electrode (not shown) is provided. The cathode electrode (not shown) of the semiconductor element S1b is connected to the lead frame F1.

A part of the lead frame F1, the semiconductor elements S1a, S1b, a part of the lead frame F2, and the plurality of wires W1 are sealed by the package P1. As described before, the package P1 is made of the resin R1. That is, a part of the lead frame F1, the semiconductor elements S1a, S1b, a part of the lead frame F2, and the plurality of wires W1 are sealed by the resin R1. The resin R1 is a mold resin.

The semiconductor element S1a is connected to the semiconductor element S1b by the plurality of wires W1. In FIG. 2, as an example, the three wires W1 are shown. Each of the wires W1 is connected to the electrode E1a, the electrode E1b, and the lead frame F2 (see FIGS. 2 and 3). The lead frame F2 functions as an external connection terminal (emitter-side terminal) on a side of an emitter of the IGBT. A portion of each of the wires W1 close to the lead frame F2 functions as an output wire.

Moreover, to the electrode E1a of the semiconductor element S1a is connected a wire W2 as an input wire.

In the following description, the three wires W1 in FIG. 2 are also referred to as wires W1a, W1b, W1c, respectively. The wires W1a, W1b, W1c are sealed by the package P1 (resin R1). The number of wires W1 connecting the semiconductor element S1a and the semiconductor element S1b is not limited to three, but may be two, or four or more.

FIG. 3 shows a shape of the wire W1a in a vertical plane (YZ plane). Shapes of the wires W1b, W1c in the vertical plane (YZ plane) are also similar to the shape of the wire W1a in FIG. 3.

Next, a characteristic configuration of the present preferred embodiment (hereinafter, also referred to as a "configuration Ct1") will be described. In the following description, as one example, the wires W1a, W1b will be mainly described.

Referring to FIGS. 2 and 3, the wire W1a has a contact n1 connected to the semiconductor element S1a (electrode E1a) and a contact n2 connected to the semiconductor element S1b (electrode E1b). Moreover, the wire W1b has a contact n3 connected to the semiconductor element S1a (electrode E1a) and a contact n4 connected to the semiconductor element S1b (electrode E1b).

In the following description, a portion between the contact n1 and the contact n2 of the wire W1a is also referred to as a "linear portion W1ap". The linear portion W1ap is curved in the vertical plane (YZ plane). A shape of the linear portion W1ap in the vertical plane (YZ plane) is a substantially arc or an arc (loop shape). That is, the linear portion W1ap has an undulation.

Moreover in the following description, a portion between the contact n3 and the contact n4 of the wire W1b is also referred to as a "linear portion W1bp". The linear portion W1bp is curved in the vertical plane (YZ plane). A shape of the linear portion W1bp in the vertical plane (YZ plane) is a substantially arc or an arc (loop shape). That is, the linear portion W1bp has an undulation.

In the following description, a top portion (loop top portion) of the linear portion W1$ap$ is also referred to as a "top portion T1$a$". Moreover, in the following description, a top portion (loop top portion) of the linear portion W1$bp$ is also referred to as a "top portion T1$b$". The top portion T1$a$ of the linear portion W1$ap$ is adjacent to the top portion T1$b$ of the linear portion W1$bp$. In the following description, an interval between the top portion T1$a$ and the top portion T1$b$ is also referred to as a "top portion interval Ab". The top portion interval Ab is a shortest distance between the top portion T1$a$ and the top portion T1$b$. Moreover, in the following description, a peripheral region of the top portions T1$a$, T1$b$ is also referred to as a "top portion peripheral region".

In the following description, a situation where an overcurrent flows in the plurality of wires W1 connecting the adjacent two semiconductor elements S1$a$, S1$b$ is also referred to as an "overcurrent situation". The relevant plurality of wires W1 are, for example, the wires W1$a$, W1$b$, W1$c$.

In the configuration Ct1, each of the wires W1$a$, W1$b$, W1$c$ is utilized as a fuse in the overcurrent situation. Moreover, in the configuration Ct1, the wires W1$a$, W1$b$ are configured so that heat generation is concentrated on the top portion peripheral region in the overcurrent situation. Specifically, in the configuration Ct1, the top portion interval Ab is narrower than an interval between the contact n1 and the contact n3. Moreover, in the configuration Ct1, the top portion interval Ab is narrower than an interval between the contact n2 and the contact n4.

The top portion interval Ab is, for example, k times the interval between the contact n1 and the contact n3. The "k" is a positive real number. The "k" is, for example, a value in a range of 0.1 to 0.9. The top portion interval Ab is, for example, k times the interval between the contact n2 and the contact n4.

The wires W1$a$, W1$c$ have a configuration similar to the configuration Ct1 for the wires W1$a$, W1$b$. Hereinafter, a brief description will be given. The wire W1$c$ has a contact n5 connected to the semiconductor element S1$a$ (electrode E1$a$) and a contact n6 connected to the semiconductor element S1$b$ (electrode E1$b$). In the following description, a portion between the contact n5 and the contact n6 of the wire W1$c$ is also referred to as a "linear portion W1$cp$". A shape of the linear portion W1$cp$ in the vertical plane (YZ plane) is a shape similar to the shape of the linear portion W1$bp$ in the vertical plane (YZ plane).

In the following description, a top portion (loop top portion) of the linear portion W1$cp$ is also referred to as a "top portion T1$c$". In the following description, an interval between the top portion T1$a$ and the top portion T1$c$ is also referred to as a "top portion interval Ac". A top portion interval Ac is a shortest distance between the top portion T1$a$ and the top portion T1$c$. In the following description, a peripheral region of the top portions T1$a$, T1$b$, T1$c$ is also referred to as a "top portion peripheral region". In the configuration Ct1, the wires W1$a$, W1$b$, W1$c$ are configured so that heat generation is concentrated on the top portion peripheral region in the overcurrent situation. Specifically, the top portion interval Ac is narrower than an interval between the contact n1 and the contact n5. Moreover, the top portion interval Ac is narrower than an interval between the contact n2 and the contact n6. Moreover, the interval between the top portion T1$a$ and the top portion T1$c$ is an interval equivalent to the interval between the top portion T1$a$ and the top portion T1$b$.

(Conclusion)

As described above, according to the present preferred embodiment, the wires W1$a$ has the contact n1 connected to the semiconductor element S1$a$, and the contact n2 connected to the semiconductor element S1$b$. The wire W1$b$ has the contact n3 connected to the semiconductor element S1$a$ and the contact n4 connected to the semiconductor element S1$b$.

The linear portion W1$ap$ between the contact n1 and the contact n2 of the wire W1$a$ has the undulation. The linear portion W1$bp$ between the contact n3 and the contact n4 of the wire W1$b$ has the undulation.

The top portion T1$a$ of the linear portion W1$ap$ is adjacent to the top portion T1$b$ of the linear portion W1$bp$. The interval between the top portion T1$a$ and the top portion T1$b$ is narrower than the interval between the contact n1 and the contact n3. The interval between the top portion T1$a$ and the top portion T1$b$ is narrower than the interval between the contact n2 and the contact n4.

Moreover, the wire W1$c$ has the contact n5 connected to the semiconductor element S1$a$ and the contact n6 connected to the semiconductor element S1$b$. The shape of the linear portion W1$cp$ between the contact n5 and the contact n6 of the wire W1$c$ is a shape equivalent to the shape of the linear portion W1$bp$. The interval between the top portion T1$a$ and the top portion T1$c$ is narrower than the interval between the contact n1 and the contact n5. The interval between the top portion T1$a$ and the top portion T1$c$ is narrower than the interval between the contact n2 and the contact n6.

This makes temperatures of the top portions T1$a$, T1$b$, T1$c$ higher than temperatures of the contacts n1, n3, n5 in the situation where the overcurrent flows in the wires. Therefore, the top portion T1$a$, which is a part of the wire W1$a$, the top portion T1$b$, which is a part of the wire W1$b$, and the top portion T1$c$, which is a part of the wire W1$c$, are easy to fuse due to the overcurrent. That is, a semiconductor device in which the relevant wire is easily fused in the situation where the overcurrent flows in the wire can be provided.

Moreover, according to the present preferred embodiment, the configuration is such that in the overcurrent situation, the heat generation portion of the wire is concentrated. Specifically, the wires W1$a$, W1$b$, W1$c$ are configured so that the heat generation is concentrated on the top portion peripheral region. That is, in the top portion peripheral region, heat interference easily occurs. Therefore, if the overcurrent situation occurs, the top portions T1$a$, T1$b$, T1$c$ in the top portion peripheral region are easy to fuse.

As a result, if the top portions T1$a$, T1$b$, T1$c$ are fused and the package P1 is destroyed, influence by the relevant fusing (destruction) can be confined to the top portions T1$a$, T1$b$, T1$c$, and the resin R1 in the top portion peripheral region. Accordingly, if the overcurrent situation occurs, damage can be restrained from occurring in the semiconductor elements S1$a$, S1$b$.

Moreover, according to the present preferred embodiment, the semiconductor elements S1$a$ S1$b$ are placed on the lead frame F1 functioning as the external connection terminal (collector-side terminal). That is, the metal member (lead frame F1) for the external connection terminal is also utilized as a metal member on which the semiconductor elements are placed. Thus, the metal member for placing the semiconductor elements need not be provided separately, so that an effect of realizing downsizing of the semiconductor device (module) can be obtained. This can realize simplification of a manufacturing process of the semiconductor device.

In the related configuration A, a plurality of wires functioning as fuses are provided between a metal member on which semiconductor elements (semiconductor chips) are placed, and another metal member corresponding to an external connection terminal. Therefore, in addition to the metal member on which the semiconductor elements (semiconductor chips) are placed, the metal member corresponding to the external connection terminal is provided separately. Accordingly, in the related configuration A, increasing in size of the semiconductor device (module), complication of a manufacturing process of the relevant semiconductor device, distribution of heat generation portions, and the like are problems.

Consequently, the semiconductor device 100 of the present preferred embodiment has the configuration for exerting the above-described effects. Thus, the semiconductor device 100 of the present preferred embodiment can solve each of the above-described problems.

<First Modification>

In the following description, a configuration of the present modification is also referred to as a "configuration Ctm1". The configuration Ctm1 is a configuration using a resin low in heat conductivity. The configuration Ctm1 is applied to the configuration Ct1.

Figure 4:
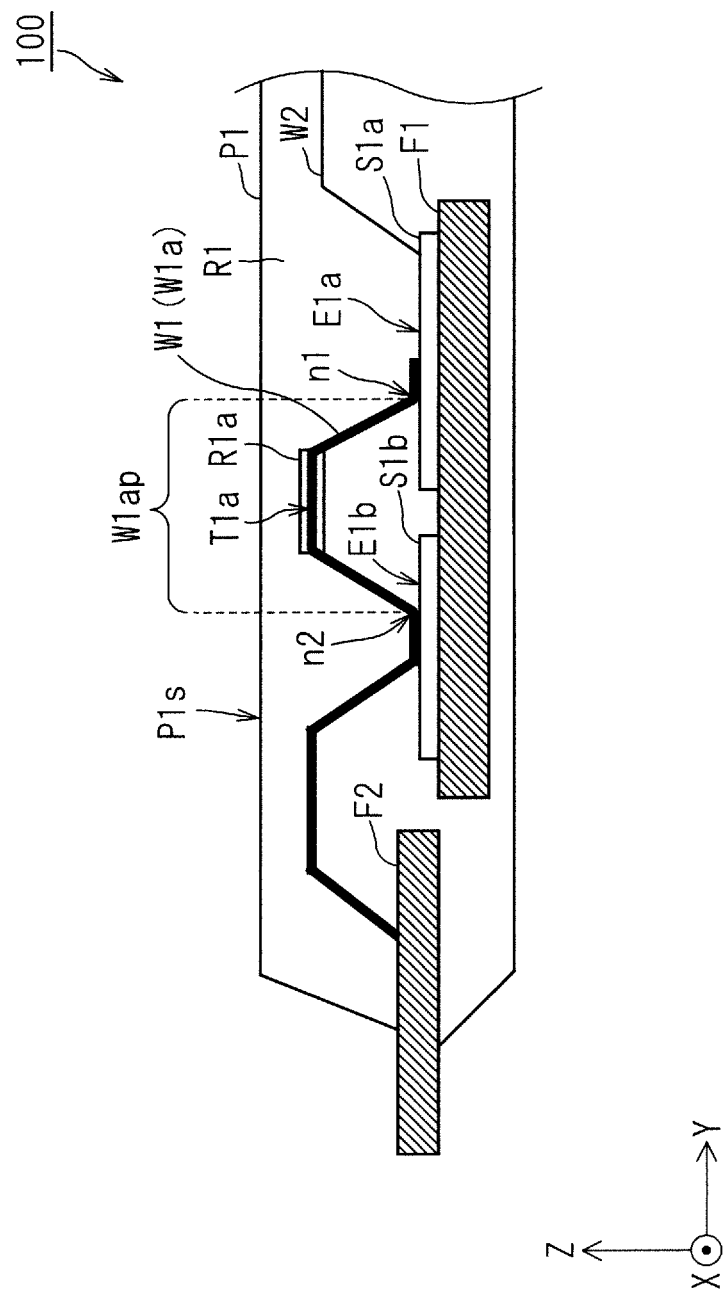
FIG. 4 is a cross-sectional view of the semiconductor device in a configuration of a first modification.

FIG. 4 is a cross-sectional view of the semiconductor device 100 in the configuration Ctm1 of a first modification. Referring to FIG. 4, in the configuration Ctm1, the semiconductor device 100 further includes a resin R1a. In the configuration Ctm1, the package P1 is made of the resin R1 and the resin R1a. The heat conductivity of the resin R1a is lower than the heat conductivity of the resin R1. That is, a heat dissipation of the resin R1a is lower than the heat dissipation of the resin R1.

In the configuration Ctm1, the top portions T1a, T1b, T1c are sealed by the resin R1a. That is, the resin R1a bundles the top portions T1a, T1b, T1c.

All or a part of the top portion T1a is sealed by the resin R1a. Moreover, all or a part of the top portion T1b is sealed by the resin R1a. Moreover, all or a part of the top portion T1c is sealed by the resin R1a.

Moreover, a portion of the wire W1a that is not sealed by the resin R1a is sealed by the resin R1. A portion of the wire W1b that is not sealed by the resin R1a is sealed by the resin R1. A portion of the wire W1c that is not sealed by the resin R1a is sealed by the resin R1.

(Conclusion)

As described above, according to the configuration Ctm1 of the present modification, the heat conductivity of the resin R1a is lower than the heat conductivity of the resin R11. That is, the heat dissipation of the resin R1a is lower than the heat dissipation of the resin R1. The top portions T1a, T1b, T1c are sealed by the resin R1a.

Moreover, the portion of the wire W1a that is not sealed by the resin R1a is sealed by the resin R1. The portion of the wire W1b that is not sealed by the resin R1a is sealed by the resin R1. The portion of the wire W1c that is not sealed by the resin R1a is sealed by the resin R1.

Thereby, in the configuration Ctm1, the heat dissipation of the top portions T1a, T1b, T1c is lower. Therefore, in the overcurrent situation, the temperatures of the top portions T1a, T1b, T1c tend to be higher than those in the configuration in FIG. 3. Accordingly, if the overcurrent situation occurs, the top portions T1a, T1b, T1c are further easier to fuse due to the overcurrent.

As a result, if the top portions T1a, T1b, T1c are fused and the package P1 is destroyed, the resin R1a serves as a starting point of the relevant destruction. Therefore, the influence by the relevant fusing (destruction) can be confined to the top portions T1a, T1b, T1c, and the resin R1a. Accordingly, if the overcurrent situation occurs, damage can be restrained from occurring in the semiconductor elements S1a, S1b.

In the configuration Ctm1, not all of the top portions T1a, T1b, T1c may be sealed by the resin R1a. For example, the top portions T1a, T1b may be sealed by the resin R1a.

<Second Modification>

In the following description, a configuration of the present modification is also referred to as a "configuration Ctm2". The configuration Ctm2 is a configuration in which a recession is provided in the upper surface of the package P1. The configuration Ctm2 is applied to all or a part of the configuration Ct1 and the configuration Ctm1.

As one example, the configuration Ct1 to which the configuration Ctm2 is applied (hereinafter, also referred to as a "configuration Ct1$m$2") will be now described. The configuration Ct1$m$2 is a configuration in which the configuration Ctm2 is applied to the configuration in FIG. 3.

Figure 5:
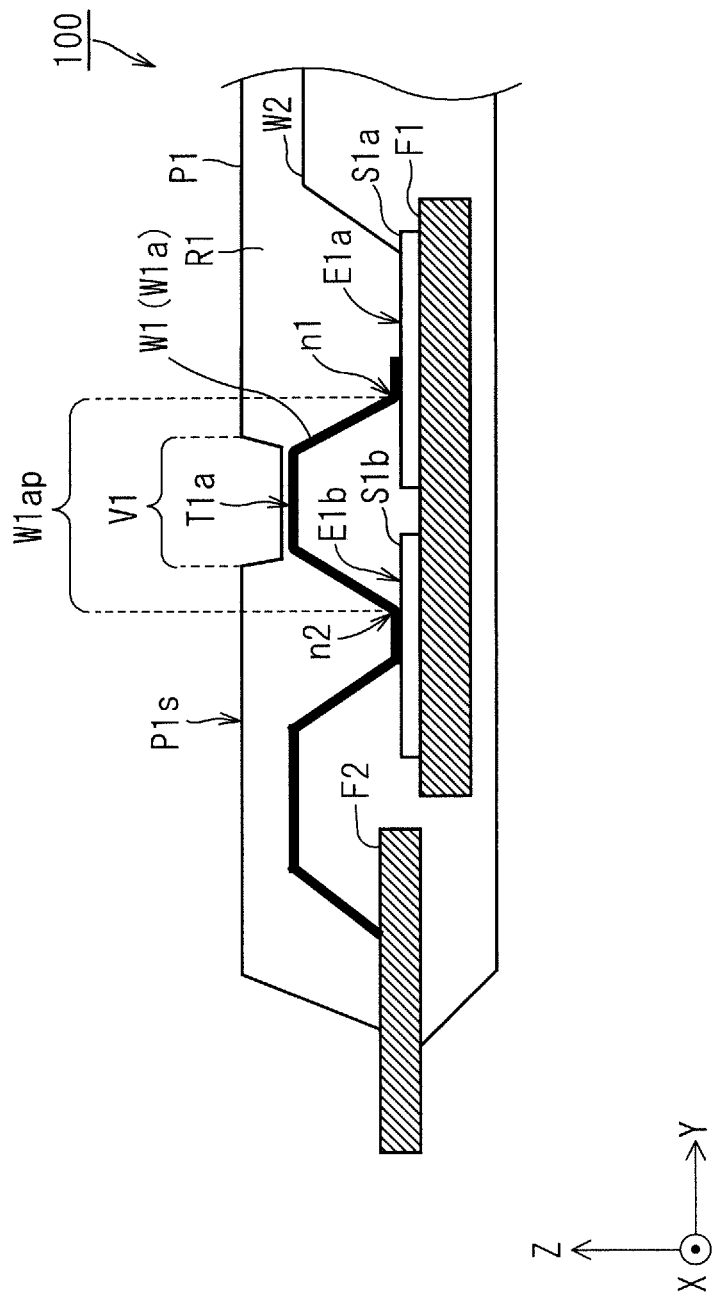
FIG. 5 is a cross-sectional view of the semiconductor device having a configuration according to a second modification.

FIG. 5 is a cross-sectional view of the semiconductor device 100 having the configuration Ct1$m$2 according to a second modification. Referring to FIG. 5, in the configuration Ct1$m$2, in a region above the top portions T1a, T1b, T1c of the upper surface P1$s$ of the package P1, a recession V1 is provided. The package P1 is made of the resin R1 (mold resin). Specifically, the recession V1 is provided so that a bottom of the recession V1 covers upper sides of the top portions T1a, T1b, T1c.

In the following description, a portion of the package P1 between the bottom of the recession V1 and the top portions T1a, T1b, T1c is also referred to as a "recession underneath". The recession underneath is a part of the package P1. In FIG. 5, a cross section of the recession underneath corresponds to a portion between the bottom of the recession V1 and the top portion T1a. A thickness of the recession underneath is small.

(Conclusion)

As described above, according to the configuration Ctm2 of the preferred modification, in the region above the top portions T1a, T1b, T1c of the upper surface P1$s$ of the package P1, the recession V1 is provided. The recession V1 is provided so that the bottom of the recession V1 covers the upper sides of the top portions T1a, T1b, T1c. Therefore, the thickness of the recession underneath in the package P1 is small. Accordingly, a physical strength of the recession underneath is small.

Therefore, if in the overcurrent situation, the top portions T1a, T1b, T1c are fused and the package P1 is destroyed, the recession underneath serves as a starting point of the destruction. Thus, the influence by the relevant fusing (destruction) can be confined to the top portions T1a, T1b, T1c, and the recession underneath. Accordingly, if the overcurrent situation occurs, damage can be restrained from occurring in the semiconductor elements S1a, S1b.

In the configuration Ctm2, the bottom of the recession V1 may cover not all of the top portions T1a, T1b, T1c. For example, the recession V1 may be provided so that the bottom of the recession V1 covers the upper sides of the top portions T1a, T1b.

<Third Modification>

In the following description, a configuration of the present modification is also referred to as a "configuration Ctm3". The configuration Ctm3 is a configuration using a resin low in Young's modulus. The configuration Ctm3 is applied to the configuration Ct1.

Figure 6:
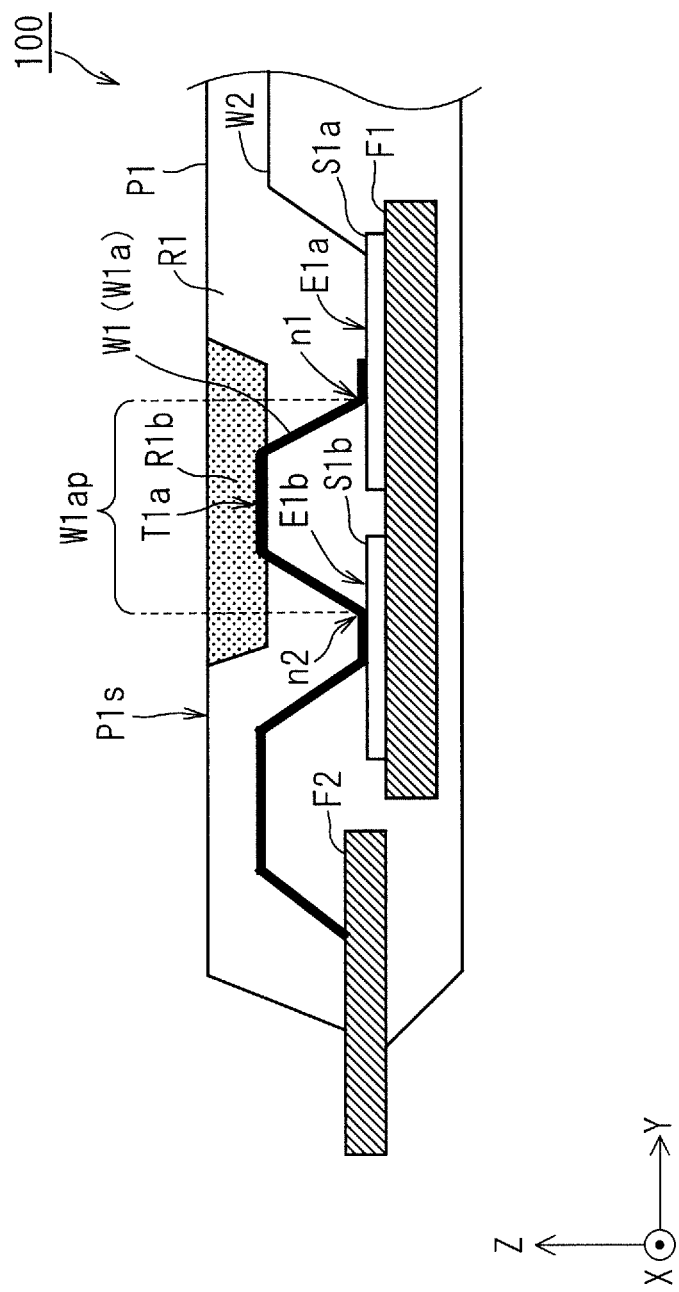
FIG. 6 is a cross-sectional view of the semiconductor device in a configuration of a third modification.

FIG. 6 is a cross-sectional view of the semiconductor device 100 in the configuration Ctm3 of a third modification. Referring to FIG. 6, in the configuration Ctm3, the semiconductor device 100 further includes a resin R1b. In the configuration Ctm3, the package P1 is made of the resin R1 and the resin R1b. Young's modulus of the resin R1b is smaller than Young's modulus of the resin R1. That is, the resin R1b is soft than the resin R1. That is, the heat dissipation of the resin R1b is lower than the heat dissipation of the resin R1.

In the configuration Ctm3, states of the top portions T1a, T1b, T1c are states St1. The states St1 are states where the top portions T1a, T1b, T1c are in contact with the resin R1b. In this case, a portion of the wire W1a that is not in contact with the resin R1b is sealed by the resin R1. Moreover, a portion of the wire W1b that is not in contact with the resin R1b is sealed by the resin R1. Moreover, a portion of the wire W1c that is not in contact with the resin R1b is sealed by the resin R1.

The states of the top portions T1a, T1b, T1c may be states St2. The states St2 are states where the top portions T1a, T1b, T1c exist inside the resin R1b. In this case, a portion of the wire W1a that does not exist inside the resin R1b is sealed by the resin R1. A portion of the wire W1b that does not exist inside the resin R1b is sealed by the resin R1. A portion of the wire W1c that does not exist inside the resin R1b is sealed by the resin R1.

(Conclusion)

As described above, according to the configuration Ctm3 of the present modification, Young's modulus of the resin R1b is smaller than Young's modulus of the resin R1. That is, the heat dissipation of the resin R1b is lower than the heat dissipation of the resin R1. The top portions T1a, T1b, T1c are in contact with the resin R1b. In this case, the portion of the wire W1a that is not in contact with the resin R1b is sealed by the resin R1. Moreover, the portion of the wire W1b that is not in contact with the resin R1b is sealed by the resin R1. Moreover, the portion of the wire W1c that is not in contact with the resin R1b is sealed by the resin R1.

The top portions T1a, T1b, T1c may exist inside the resin R1b. In this case, the portion of the wire W1a that does not exist inside the resin R1b is sealed by the resin R1. The portion of the wire W1b that does not exist inside the resin R1b is sealed by the resin R1. The portion of the wire W1c that does not exist inside the resin R1b is sealed by the resin R1.

The above-described configuration can decrease the heat dissipation of the top portions T1a, T1b, T1c. Thus, effects similar to those in the first modification can be obtained. For example, if the top portions T1a, T1b, T1c are fused and the package P1 is destroyed, the resin R1b serves as a starting point of the relevant destruction. Thus, the influence by the relevant fusing (destruction) can be confined to the top portions T1a, T1b, T1c, and the resin R1b. Accordingly, if the overcurrent situation occurs, damage can be restrained from occurring in the semiconductor elements S1a, S1b.

In the configuration Ctm3, not all the states of the top portions T1a, T1b, T1c may be the states St1 or St2. For example, the states of the top portions T1a, T1b may be the states St1. The relevant states St1 are states where the top portions T1a, T1b are in contact with the resin R1b.

Moreover, for example, the states of the top portions T1a, T1b may be the states St2. The relevant states St2 are states where the top portions T1a, T1b exist inside the resin R1b.

It should be noted that, within the scope of the present invention, the preferred embodiment and the modifications can be freely combined, and the preferred embodiment and the modifications can be appropriately modified or omitted.

For example, the semiconductor element S1a may be a semiconductor element other than a switching element. Moreover, the semiconductor element S1b may be a semiconductor element other than a free wheeling diode.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a first semiconductor element; and
    a second semiconductor element adjacent to the first semiconductor element in a plan view,
    wherein the first semiconductor element is connected to the second semiconductor element by a first wire and a second wire,
    the first wire has:
        a first contact connected to the first semiconductor element; and
        a second contact connected to the second semiconductor element,
    the second wire has:
        a third contact connected to the first semiconductor element; and
        a fourth contact connected to the second semiconductor element,
    a first linear portion of the first wire has an undulation, the first linear portion being a portion between the first contact and the second contact,
    a second linear portion of the second wire has an undulation, the second linear portion being a portion between the third contact and the fourth contact,
    a first top portion of the first linear portion is adjacent to a second top portion of the second linear portion,
    an interval between the first top portion and the second top portion is narrower than an interval between the first contact and the third contact, and
    the interval between the first top portion and the second top portion is narrower than an interval between the second contact and the fourth contact.

2. The semiconductor device according to claim 1, further comprising a first resin and a second resin,
    wherein a heat conductivity of the second resin is lower than a heat conductivity of the first resin,
    the first top portion and the second top portion are sealed by the second resin,
    a portion of the first wire that is not sealed by the second resin is sealed by the first resin, and
    a portion of the second wire that is not sealed by the second resin is sealed by the first resin.

3. The semiconductor device according to claim 1, wherein
    the first wire and the second wire are sealed by a package,
    the package is made of a first resin, and
    a recession is provided in a region above the first top portion and the second top portion of an upper surface of the package.

4. The semiconductor device according to claim 1, further comprising a first resin and a third resin,
    wherein Young's modulus of the third resin is smaller than Young's modulus of the first resin,
    a state of the first top portion and the second top portion is a first state where the first top portion and the second top portion are in contact with the third resin, or a second state where the first top portion and the second top portion exist inside the third resin, a portion of the first wire that is not in contact with the third resin, or a portion of the first wire that does not exist inside the third resin is sealed by the first resin, and a portion of the second wire that is not in contact with the third resin, or a portion of the second wire that does not exist inside the third resin is sealed by the first resin.

* * * * *